United States Patent [19]

Cergel et al.

[11] Patent Number: 5,446,247

[45] Date of Patent: Aug. 29, 1995

[54] ELECTRICAL CONTACT AND METHOD FOR MAKING AN ELECTRICAL CONTACT

[75] Inventors: Lubomir Cergel, Geneva, Switzerland; Barry C. Johnson, Scottsdale; John W. Stafford, Phoenix, both of Ariz.

[73] Assignee: Motorola, Inc., Schaumburg, Ill.

[21] Appl. No.: 154,576

[22] Filed: Nov. 19, 1993

[51] Int. Cl.⁶ .................................. H05K 1/00
[52] U.S. Cl. ........................... 174/267; 174/250; 174/259; 174/260; 174/261; 174/263; 361/767; 361/771; 361/777
[58] Field of Search ............... 174/250, 259, 260, 261, 174/262, 263, 268, 267; 228/179, 180.1, 180.2; 361/760, 765, 767, 770, 771, 777; 439/68, 69, 70

[56] References Cited

U.S. PATENT DOCUMENTS 4,806,706  2/1989  Machida et al. .
5,280,414  1/1994  Davis et al. .

*Primary Examiner*—Leo P. Picard
*Assistant Examiner*—Cheryl R. Figlin
*Attorney, Agent, or Firm*—Aaron B. Bernstein

[57] ABSTRACT

An electrical contact and method for making an electrical contact allows a flat contact (404) to be formed early in the process of making an electronic device. The flat contact (404) is level with the remainder of the substrate (116) in which it is formed. The flat contact (404) does not interfere with any required subsequent process steps. The flat contact can be reflowed to form a ball contact (302) which protrudes above the top of the substrate (120) to which it is attached.

7 Claims, 2 Drawing Sheets

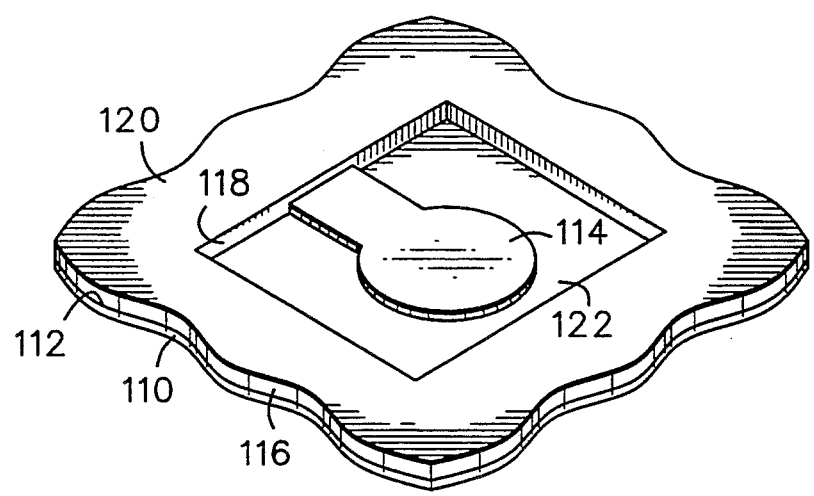
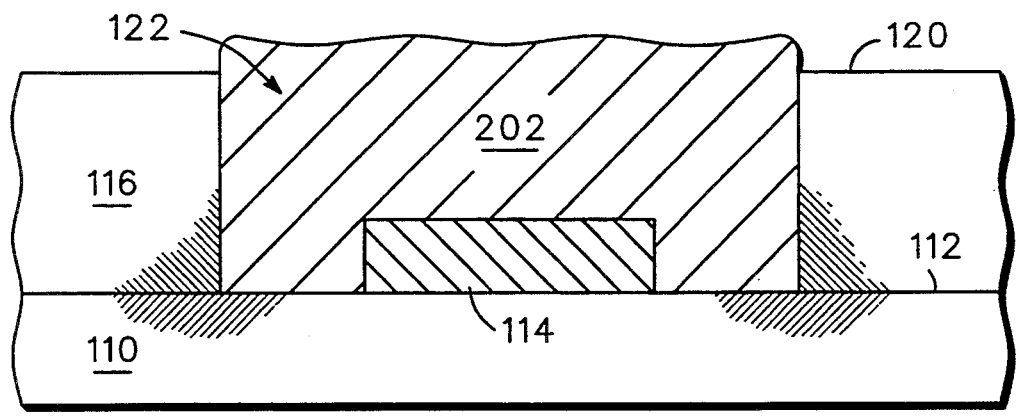

ELECTRICAL CONTACT AND METHOD FOR MAKING AN ELECTRICAL CONTACT

BACKGROUND OF THE INVENTION

The present invention relates to electrical contacts, and more particularly to electrical contacts which may take the form of ball contacts.

In the past, solder balls have been used for electrical contacts. For example, solder balls have been used to attach semiconductor die to a package or module. Additionally, solder balls have been used to provide electrical contacts from semiconductor device packages to printed wire boards, module level boards, or the outside world. One method for forming the balls has been to pick up preformed solder balls and physically attach them to the desired surface. Solder balls so attached fall off quite easily from forces in the sheer direction and from vibration and acceleration.

Another method that has been employed in the past is to plate the electrical contact material (typically solder) above the surface where the solder ball is to be attached and then reflow the plated solder to form a ball.

A disadvantage of both methods described is that the ball contacts must be formed as one of the last steps of the device manufacturing process. This is because, according to both methods, a ball contact or electroplated solder material protrudes above the surface to which it is attached. Therefore, the surface is no longer flat, so the device being fabricated can not undergo further processes which require a flat surface. For example, most conventional photolithographic processes as well as deposition processes require that the die being processed have substantially flat surfaces, or at least a flat bottom. Therefore, the prior art methods must be performed toward the end of processing.

What is needed is a method for fabricating an electrical contact which may have the form of a ball contact, and which does not easily break or fall off. Furthermore, what is needed is a method for forming an electrical contact which can be performed relatively early in the device processing cycle and is compatible with later processing steps.

BRIEF DESCRIPTION OF THE DRAWINGS

FIG. 1 is a perspective view of a portion of a circuit board in accordance with one embodiment of the present invention, before the electrical contact is formed;

FIG. 2 is a cross-section view of the board of FIG. 1, after solar paste has been printed;

DETAILED DESCRIPTION OF THE DRAWINGS

Figure 3:
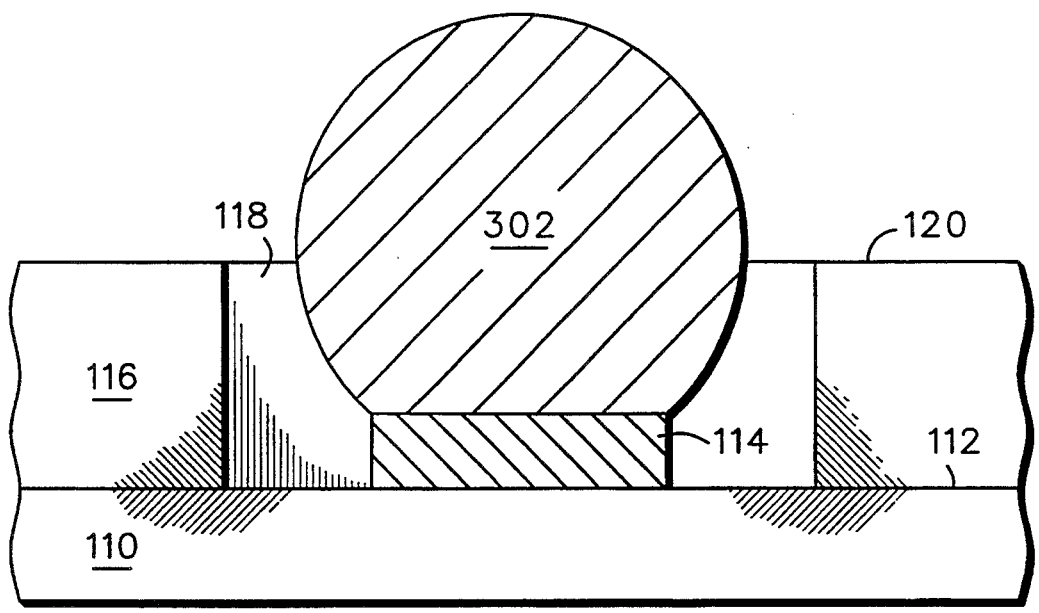
FIG. 3 is a cross-section view of the board of FIG. 2, after the solder paste has been reflowed.

According to the preferred method of the present invention, an electrical contact is formed on a printed circuit board or similar substrates including but not limited to polyimides, polyesters and the like. The electrical contact may eventually take the form of a ball contact as required by many modern packaging and attachment techniques. However, in an intermediate step, the electrical contact is compressed flat, to be planar to the remainder of the board, allowing for subsequent conventional processing steps. Later, a ball contact can be formed with a simple reflow process. In the preferred embodiment, solder is used as the electrical contact material, and the resultant contact is a solder ball. Nevertheless, it should be understood that the present invention encompasses a variety of other materials, besides solder, which can be used as electrical contact.

More specifically, according to the preferred method, a relatively thick solder mask is disposed on a surface of the circuit board. In order to achieve the needed thickness, more than one application of mask may be used. In some cases, the later mask can be removed near the end of the processing sequence.

The solder mask has openings surrounding bond pads which have previously been printed on the circuit board. Solder paste is printed according to well known stencil or screen printing techniques into the openings in the solder mask. The solder paste is reflowed to form a solder ball attached to the bond pad and protruding above the top surface of the solder mask. The solder ball is compressed to be level and planar with the top surface of the solder mask. This allows for subsequent conventional processing steps. Finally, the compressed electrical contact is reflowed to form a final solder ball electrical contact. The solder mask may then optionally be removed.

The openings in the solder mask can be defined with well known methods so that they have a specific volume. In the preferred embodiment, this volume will be filled with the compressed solder ball. It should be understood that the volume of the opening should therefore be chosen such that a solder ball having the same volume protrudes past the top of the solder mask layer. Determining the volume of a ball contact formed on a pad is well known in the art, and explained for example in P.M. Hall, *Solder Post Attachment Of Ceramic Chip Carriers to Ceramic Film Integrated Circuits*, CH671-7181/0000-0172, IEEE, 1981, which is incorporated herein by reference. The height of the ball can of course be determined from its volume, and visa versa. The volume occupied by the pad itself is also taken into account if it is significant relative to the overall volume.

Turning to the figures for further detail, FIG. 1 is a perspective view of a circuit board in accordance with the preferred embodiment of the present invention. Circuit board 109 includes a bottom board 110. Bottom board 110 has a first top surface 112. Bond pad 114 is printed on top surface 112 of board 110 according to well known methods. Bond pad 114 is electrically conductive, as will be understood by those skilled in the art.

Preferably, solder mask layer 116 is a laminated solder mask, as is well known in the art. According to the preferred embodiment, solder mask 116 is a dry film resist such as Dupont™ SIPAD™ or OPTIPAD™. It will be understood by those skilled in the art that these dry film resists are capable of providing wall definitions having thicknesses of 0.076–0.127 mm. It will also be understood that solder mask could be applied more than once in order to achieve the desired volume of solder over pad 114. Also, a combination of different masks might be used.

Solder mask layer 116 includes solder mask walls represented by wall 118. The solder mask walls are defined by well known photolithographic methods. Solder mask layer 116 also includes a top surface 120.

The solder mask walls represented by wall 118 surround solder pad 114. The walls thus define walled area 122. According to the preferred embodiment, walled area 122 is square. In the preferred embodiment, the walls completely surround pad 114, thus defining a wall volume.

FIG. 2 is a cross-section view of FIG. 1 after solder paste is printed into walled area 122 by well known stencil or screen printing methods. In the preferred embodiment, the amount of solder desired is the amount that exactly fills the volume of walled area 122. However, as illustrated by FIG. 2, the amount of solder paste printed exceeds the volume of walled area 122 by a predetermined amount. The extra volume accounts for the volume occupied by the binders in the solder paste which are burned off when the solder paste is reflowed. The precise volume ratio of the binders in the paste is available from conventional solder paste manufacturers, or can be determined empirically.

The solder paste used in the preferred embodiment is 40/60 lead/tin which has a liquidous at about 210° C. This relatively high temperature solder allows forming the electrical contact early in the device manufacturing process because later processes are typically carried out at temperatures lower than 210° C. For example, conventional thermosonic wire bond heat assist is carried out from around 125° C.–175° C. Additionally, epoxy overmolding is carried out at approximately 175° C.

FIG. 3 is a cross-section of the board of FIG. 2 after paste 202 has been reflowed to form solder ball 302. As discussed previously, the volume geometries of walled area 122 have been chosen so that a solder ball having the volume of walled area 122 will protrude over top surface 120 of solder mask 116 to provide a solder ball which can be attached to another surface.

Figure 4:
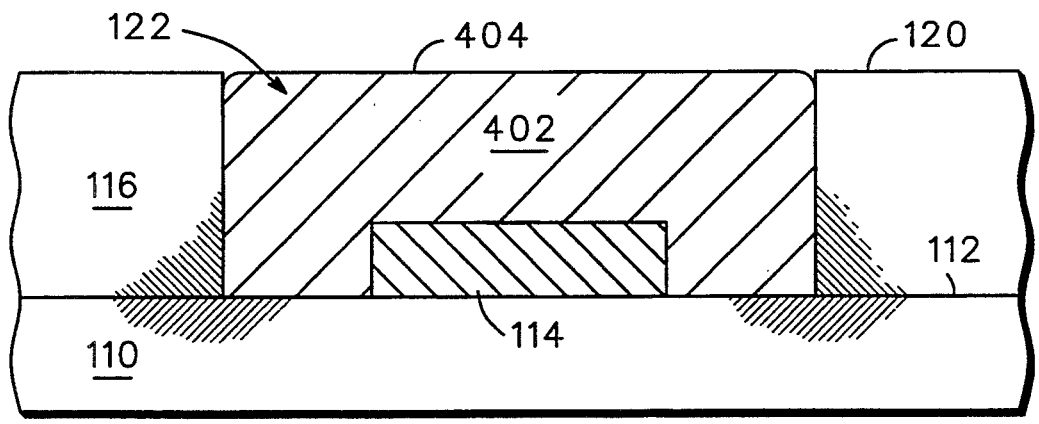
FIG. 4 is a cross-section view of the board of FIG. 3, after the solder ball has been compressed.

FIG. 4 is a cross-section of the board of FIG. 3 after solder ball 302 has been compressed into flattened solder contact 402. Since solder ball 302 had the volume equal to the volume of walled area 122 (minus the volume consumed by bond pad 114 if significant), flattened solder contact 402 now substantially fills the volume of walled area 122. Solder ball 302 can be compressed with well known methods such a hydraulic press or similar mechanical weight being applied.

Flattened solder contact 402 includes contact top surface 404. Contact top surface 404 is level and planar to solder mask top surface 120. Consequently, the board 109 in this condition can undergo further conventional processing techniques without the electrical contact interfering.

Once the entire device or package is completed, flattened solder contact 402 can be reflowed to again form a solder ball identical to solder ball 302 of FIG. 3. Thus, solder balls are provided on a completed package, die, substrate, etc., depending on the particular application.

By now it should be appreciated that an electrical contact and method for making an electrical contact is provided where the contact can be formed early in the process of making an electronic device. The contact remains level with the remainder of the board, substrate, etc., and is compatible with subsequent processing steps. A ball contact can be formed as a last step with a simple reflow.

We claim:
1. An electrical contact comprising:
   a board having a first surface;
   a bond pad formed on the first surface;
   a solder mask having a top surface and walls around the bond pad; and
   a flattened solder contact within the walls and contacting the bond pad, the flattened solder contact having a contact top surface substantially level with the solder mask top surface.
2. The electrical contact of claim 1, wherein the bond pad is substantially circular.
3. The electrical contact of claim 1, wherein the bond pad has a bond pad volume, the flattened solder contact has a contact volume and the walls define a wall volume, and wherein the sum of the pad volume and the contact volume is substantially equal to the wall volume.
4. The electrical contact of claim 1, wherein the walls completely surround the bond pad.
5. The electrical contact of claim 1, wherein the solder mask comprises dry film resist and has a thickness in the range of 0.076–0.127 mm.
6. The electrical contact of claim 1, wherein the walls define a walled area and wherein the flattened solder contact substantially fills the walled area.
7. The electrical contact of claim 6, wherein the walled area is square shaped.

* * * * *